United States Patent
Motzkau et al.

(10) Patent No.: US 10,404,215 B2
(45) Date of Patent: Sep. 3, 2019

(54) SYNCHRONIZED MULTIPLE CHANNEL LOCK-IN AMPLIFIER

(71) Applicants: Holger Motzkau, Solna (SE); Lars Andreas Rydh, Täby (SE)

(72) Inventors: Holger Motzkau, Solna (SE); Lars Andreas Rydh, Täby (SE)

( * ) Notice: Subject to any disclaimer, the term of this patent is extended or adjusted under 35 U.S.C. 154(b) by 0 days.

(21) Appl. No.: 15/918,115

(22) Filed: Mar. 12, 2018

(65) Prior Publication Data

US 2018/0269837 A1    Sep. 20, 2018

(30) Foreign Application Priority Data

Mar. 15, 2017    (SE) ...................................... 1750302

(51) Int. Cl.
| | |
|---|---|
| *H03F 1/32* | (2006.01) |
| *H03F 1/02* | (2006.01) |
| *H03F 3/04* | (2006.01) |
| *H03M 1/00* | (2006.01) |
| *G01R 19/25* | (2006.01) |
| *H03M 1/18* | (2006.01) |
| *G01R 19/00* | (2006.01) |

(52) U.S. Cl.
CPC ........... *H03F 1/02* (2013.01); *G01R 19/2509* (2013.01); *H03F 3/04* (2013.01); *H03M 1/00* (2013.01); *G01R 19/0053* (2013.01); *H03F 2200/171* (2013.01); *H03F 2200/372* (2013.01); *H03M 1/18* (2013.01)

(58) Field of Classification Search
CPC ..................................................... H03F 1/3252
USPC ......................... 330/126, 124 D, 295, 124 R
See application file for complete search history.

(56) References Cited

U.S. PATENT DOCUMENTS

| | | | | |
|---|---|---|---|---|
| 4,301,420 A * | 11/1981 | Sugawara | ............... | H03F 1/486 330/126 |
| 6,586,999 B2 * | 7/2003 | Richley | ................... | H03F 3/211 330/124 R |
| 6,914,480 B2 * | 7/2005 | Arai | ....................... | H03G 3/004 330/126 |
| 7,876,159 B2 * | 1/2011 | Wang | .................... | H03F 1/0288 330/124 R |
| 9,203,535 B2 * | 12/2015 | Chang | ................ | H04N 21/6143 |
| 2005/0110565 A1 * | 5/2005 | Robinson | ................ | H03C 5/00 330/124 R |

(Continued)

*Primary Examiner* — Henry Choe

(57) ABSTRACT

The disclosure relates to a lock-in amplifier comprising a plurality of channels ($CH_1$-$CH_N$), wherein each channel of the plurality of channels ($CH_1$-$CH_N$) is configured to receive an input signal ($S_{in1}$-$S_{inN}$) and generate at least one output signal ($S_{out1}$-$S_{outN}$), a synchronization unit (110) configured to synchronize the generated output signals ($S_{out1}$-$S_{outN}$) of the plurality of channels ($CH_1$-$CH_N$), an aggregation module (150) configured to receive the generated output signals ($S_{out1}$-$S_{outN}$) and generate an aggregated signal ($S_{agg}$) based on the generated output signals ($S_{out1}$-$S_{outN}$).

10 Claims, 6 Drawing Sheets

(56) References Cited

U.S. PATENT DOCUMENTS

2012/0280746 A1* 11/2012 Deuchars ............. H03F 1/0227
330/124 R

* cited by examiner

SYNCHRONIZED MULTIPLE CHANNEL LOCK-IN AMPLIFIER

TECHNICAL FIELD

The present invention relates to a lock-in amplifier, in particular a lock-in amplifier for generating aggregated measurement values.

BACKGROUND

Lock-in amplifiers are traditionally devices capable of recovering and measuring a signal obtained in a noisy environment. Conventional lock-in amplifiers typically convert the phase and/or the amplitude of a measured signal to a direct current, DC, voltage signal. Nowadays, lock-in amplifiers usually directly return the digitally obtained measurement result as a digital value or discrete output signal.

A conventional lock-in amplifier can often measure the input signal with a resolution and accuracy better than that given by noise and stability of the input hardware by providing a known signal to the measured object. A problem is that the signal provided to the measured object may not be stable and vary over time.

When trying to measure and study aggregated aspects of a measurement object, a plurality of channels of one or more lock-in amplifiers may be used. The result from each channel is then combined or aggregated externally to obtain an aggregated value. Various differences in timing between the channels may result in a degraded quality of the aggregated value.

An example of such an aggregated value or values may be a resistance value of a resistor. A first channel of the lock-in amplifier may monitor the voltage over the resistor. A second channel of the lock-in amplifier may simultaneously monitor the current flowing through the resistor. An aggregated value can then be generated based on the output signals of the first and second channels of the lock-in amplifier.

A problem with conventional measurement systems is that if the measured object property, such as resistance, or the signal source providing the measured object with a signal or signals is not ideal or varies over time, the aggregated value will vary over time. In the above mentioned example of a resistor, even a small time shift may distort the result if the resistor depends on temperature and the temperature is changing. Similarly, a constant resistance may appear to vary if the signal source is varying over time. Thus, the quality of the aggregated value is reduced or degraded.

Thus, there is a need for an improved lock-in amplifier, in particular a lock-in amplifier for generating aggregated measurement values.

OBJECTS OF THE INVENTION

An objective of embodiments of the present invention is to provide a solution which mitigates or solves the drawbacks and problems described herein.

SUMMARY OF THE INVENTION

The above and further objectives are achieved by the subject matter of this disclosure. Further advantageous implementation forms of the invention are defined herein.

According to a first aspect of the invention, this objective is achieved by a lock-in amplifier comprising a plurality of channels, wherein each channel of the plurality of channels is configured to receive an input signal and generate an output signal. The lock-in amplifier further comprises a synchronization unit configured to synchronize the generated output signals of the plurality of channels. The lock-in amplifier further comprises an aggregation module configured to receive the generated output signals, and generate an aggregated signal based on the generated output signals.

A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

An "or" in this description and the corresponding claims is to be understood as a mathematical OR which covers "and" and "or", and is not to be understand as an XOR (exclusive OR). The indefinite article "a" in this disclosure and claims is not limited to "one" and can also be understood as "one or more", i.e., plural.

In the following disclosure the term "channel" is used to describe circuitry for processing an input signal to an output signal separately from other signal paths in the lock-in amplifier.

Figure 1:
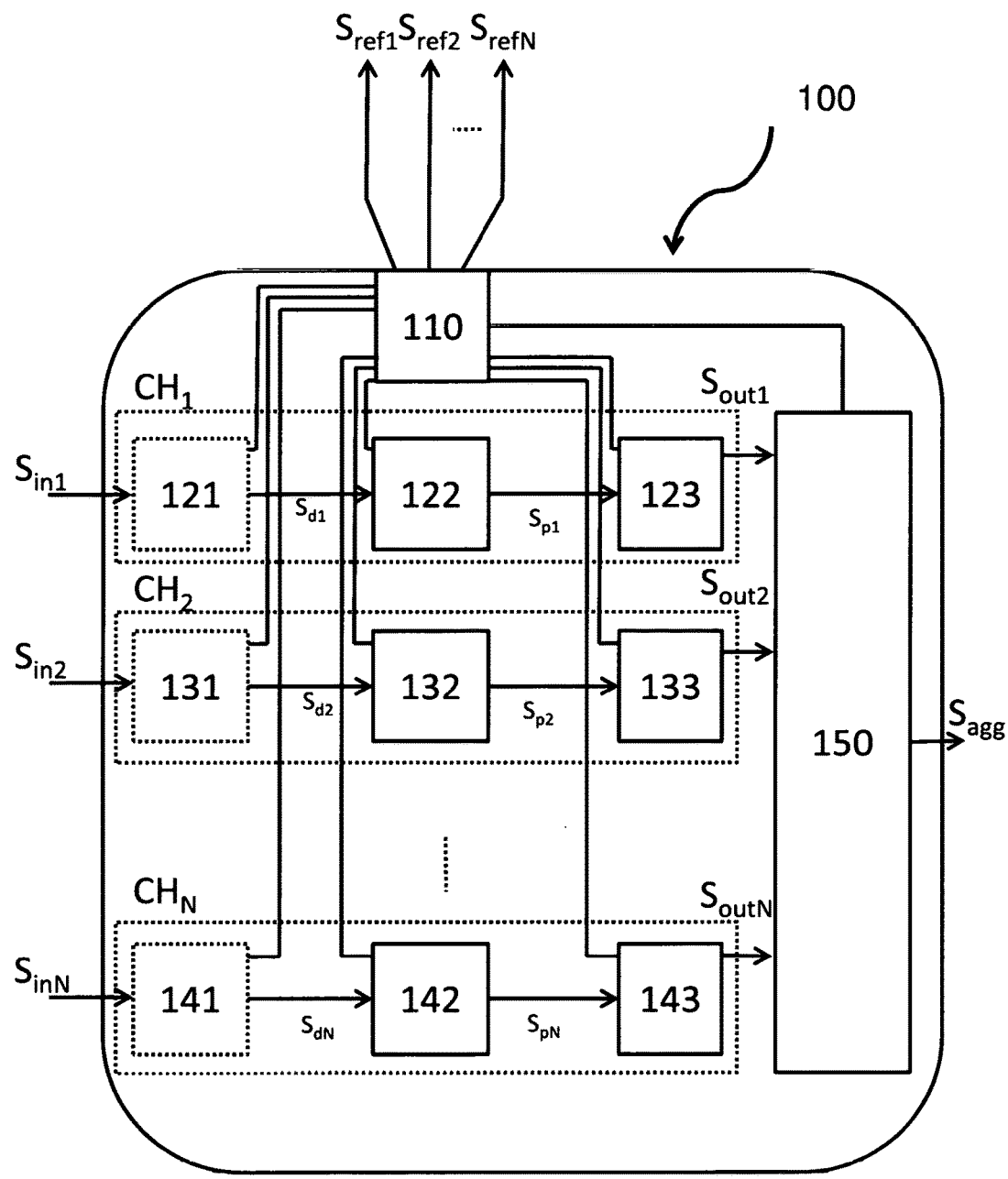
FIG. 1 shows a lock-in amplifier, according to the present disclosure.

FIG. 1 shows a lock-in amplifier 100, according to the present disclosure. The lock-in amplifier 100 comprises a plurality of channels $CH_1$-$CH_N$, wherein each channel of the plurality of channels $CH_1$-$CH_N$ is configured to receive an input signal $S_{in1}$-$S_{inN}$ and generate an output signal $S_{out1}$-$S_{outN}$. The plurality of channels $CH_1$-$CH_N$ may be measurement channels of the lock-in amplifier 100. The lock-in amplifier 100 further comprises a synchronization unit 110 configured to synchronize the generated output signals of the plurality of channels $CH_1$-$CH_N$, e.g. by sending one or more control signals. In an example, the output signals $S_{out1}$-$S_{outN}$ from each of the plurality of channels $CH_1$-$CH_N$ are synchronously generated or updated, e.g. by receiving the one or more control signals from the synchronization unit 110. The synchronization unit 110 is communicatively coupled to each of the plurality of channels $CH_1$-$CH_N$. In one embodiment, the synchronization unit 110 is further configured to provide channel reference signals $S_{ref1}$, $S_{ref2}$, ..., $S_{refN}$ to each of the plurality of channels $CH_1$-$CH_N$. In one embodiment, the synchronization unit 110 is further configured to provide channel reference signals $S_{ref1}$, $S_{ref2}$, $S_{refN}$ or signals based thereupon to external units, such as to bias samples or sensors.

The lock-in amplifier 100 may further comprise an aggregation module 150. The aggregation module 150 may be configured to receive the output signal or signals $S_{out1}$-$S_{outN}$ of the plurality of channels $CH_1$-$CH_N$, and generate an aggregated signal $S_{agg}$ based on the output signals of the plurality of channels $CH_1$-$CH_N$. The aggregated signal may comprise the output signals of the plurality of channels $CH_1$-$CH_N$ aggregated as a synchronized dataset, a result of performing a calculation based on the output signals of the plurality of channels $CH_1$-$CH_N$ or a combination thereof. The calculation may comprise applying any arithmetic operator or function to obtain one or more aggregated values. E.g. receiving output signals indicative of the voltage over the resistor and the current flowing through the resistor.

A further example of the usefulness of the present disclosure is when the resistance of an unknown resistor $R_2$ is determined using a known reference resistor $R_1$ in a series circuit. In this example, a current I is sent through the resistors $R_1$, $R_2$ and the voltages $V_1$ and $V_2$ over the resistors are measured. In the ideal case, the measured voltages are $V_1=I*R_1$ and $V_2=I*R_2$, resulting in $R_2=(V_2*/V_1)*R_1$. This is the case regardless of the time dependence of I. In reality, there are, however, several complications that may make the measurement far from ideal. First of all, the voltage readings usually come with offset errors due to ADC input and output offsets or thermal emf:s. For measurements using a dc-current through the resistors, such offsets would distort the result. A good solution to this is to use an ac-current source of known frequency f and measure the amplitude of the voltages $V_1(t)$ and $V_2(t)$ at that frequency, which may be performed using lock-in amplifiers. With $V_1$ and $V_2$ representing the amplitudes, the unknown resistor $R_2$ then is $R_2=(V_2/V_1)*R_1$. With a measurement time constant $\tau$, any noise at frequencies outside the frequency range $\Delta f=1/\tau$ around f can be filtered away. By increasing the time constant $\tau$, the measurement bandwidth $\Delta f$ decreases, further reducing the effect of the remaining voltage measurement noise within the bandwidth. Any current noise within the measurement bandwidth will give rise to correlated noise of the two voltages and will thus act as a signal. The same is the case if the current amplitude I is time dependent. If the measurements of $V_1$ and $V_2$ are synchronous in time, such noise or time dependence will not affect the measurement result, but if the measurements are not synchronous, an error will be introduced. To see this, I(t) may be set as a time-dependent current amplitude with variations within the time constant $\tau$. A voltage amplitude measurement at time t will be proportional to the time-average of the current amplitude I taken over the measurement time constant $\tau$. Let $V_1$ be measured at time $t_1$ and $t_2$ and $V_2$ at time $t_2$. The measurement result then is:

$$R_{2,meas} = \frac{V_2}{V_1}*R_1 = \frac{\text{time average}(V_2(t))_{t2-\tau}^{t2}}{\text{time average}(V_1(t))_{t1-\tau}^{t1}}*R_1 = \frac{\text{time average}(I(t))_{t2-\tau}^{t2}}{\text{time average}(I(t))_{t1-\tau}^{t1}}*R_2$$

which will only give $R_{2;meas}=R_2$ if the measurements are taken at the same time, $t_1=t_2$, with equivalent time constants. This illustrates the advantage of the present disclosure. The technique enables correct measurements despite a time-varying current and current noise at any frequency, including frequencies within the measurement bandwidth. To further illustrate using numbers, assume that I(t) is increased by 10% each measurement time constant and that $t_2-t_1$ is $\frac{1}{10}$th offset in the case of using two separate lock-in amplifiers. In the case of time-synchronous measurements, $R_2$, can be determined correctly, with an accuracy only limited by measurement system calibration. A theoretically achievable result is 1 in $10^5$ to $10^6$. In the case of separate non-synchronized lock-in amplifiers, the measurement error will be given by the product of the change and the relative time mismatch, in this case with a measurement error 10%*10%=1%. To avoid any significant errors when the measurement current was changed, the mismatch thus needs to be less than 0.01% in this case. Using short time constants will likely increase the relative time mismatch. Long time constants, on the other hand, will make time dependence of I(t) appear fast relative to the measurements. It may also be that the resistor $R_2$ has a time dependence that should be studied (maybe caused by a varying temperature). In this case, a short time constant is needed to properly represent $R_2(t)$. For such measurements, the use of a set of time-synchronous lock-in amplifiers of the present disclosure has great advantages.

In one example, the aggregation module 150 receives a first output signal indicative of a temperature of a resistor. The aggregation module 150 further receives a second output signal indicative of the voltage over the resistor and a third output signal indicative of an electrical current flowing through the resistor. The aggregation module 150 may be configured generate the aggregated signal based on the first, second and third output signal. The aggregated signal may comprise a voltage, current and temperature value aggregated as a synchronized dataset, e.g. further comprising a time stamp. The aggregated signal may further be indicative of the resistance value of the resistor as a function of the temperature or time.

Optionally, the aggregation module 150 is further configured to receive a control signal from the synchronization unit 110 and generate the aggregated signal based on the control signal, e.g. starting generation of the aggregated signal upon receiving the control signal or triggering an output of or an update of the aggregated signal on an output port.

In an embodiment, each channel of the plurality of channels $CH_1$-$CH_N$ comprises a processing module 122, 132, 142 and/or an output module 123-143. In an embodiment, each channel of the plurality of channels $CH_1$-$CH_N$ further comprises an input module 121, 131, 141.

In one embodiment, the synchronization unit 110 is further configured to provide channel reference signals $S_{ref1}$, $S_{ref2}$, $S_{refN}$ to each processing module 122, 132, 142.

Figure 2:
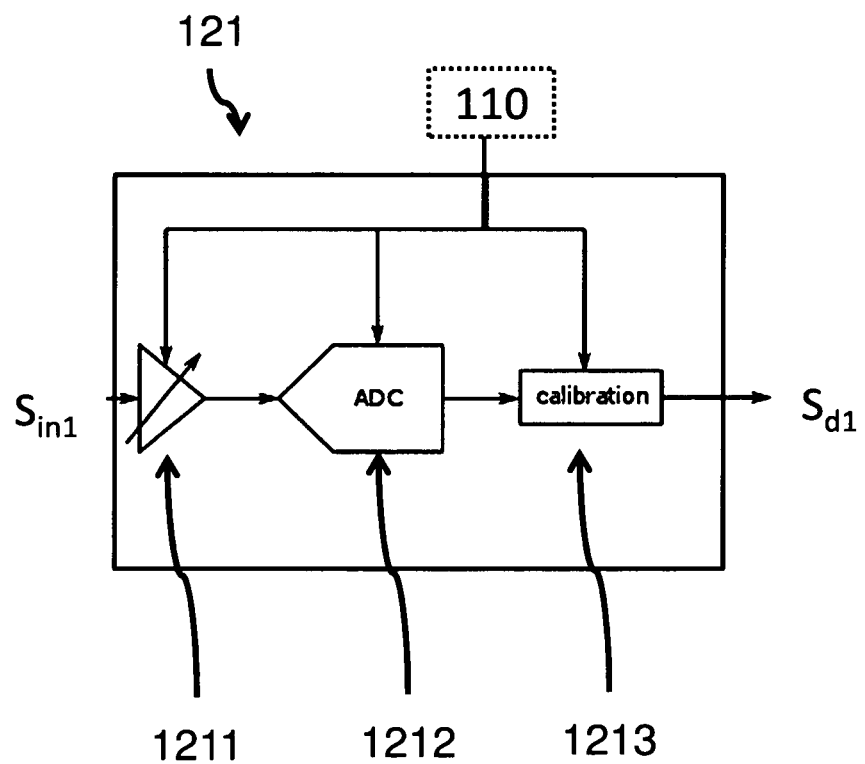
FIG. 2 shows details of an input module according to the present disclosure.

FIG. 2 shows an input module 121 according to the present disclosure. The input module 121 may comprise any combination of an analog to digital converter, ADC, 1212, a scaler 1211, and a calibration module 1213 all communicatively coupled to the synchronization unit 110. The input module 121 may comprise the scaler 1211, e.g. an amplifier, configured to scale the amplitude of the input signal $S_{in1}$ by a first scale factor in response to or based on a control signal received from the synchronization unit 110. The input signal $S_{in1}$ may be an analog signal or a digital or discrete signal. In an example, this may comprise receiving an input signal $S_{in1}$ and generate a digital or discrete input signal $S_{d1}$ having an adjusted amplitude. The input module 121 may comprise the ADC 1212 configured to receive the input signal $S_{in1}$ and generate a discrete input signal $S_{d1}$, optionally in response to or based on a control signal received from the synchronization unit 110. In one example, this may comprise receiving an analog signal and generate a digital or discrete signal, e.g. by analog to digital conversion by sampling or any suitable method known in the art. Optionally the triggering or timing of the sampling is performed in response to or based on a control signal received from the synchronization unit 110. The synchronization unit 110 may further be configured to triggering the ADC to sample the input signal $S_{in1}$ and generate the discrete input signal $S_{d1}$. The input module 121 may comprise a calibration module 1213 configured to scale or offset or adjust phase of a digitally converted signal from the ADC 1212 by a second scale factor or a second offset factor or a second phase factor in response to or based on a control signal received from the synchronization unit 110. The second scale factor may be based on the first scale factor. This has the advantage that the input signal $S_{in1}$ may be scaled to an amplitude providing best resolution in the ADC and then scaled to represent the original amplitude of the input signal $S_{in1}$. In a further example, this may comprise receiving a first digital input signal $S_{in1}$ and generate a digital or discrete input signal $S_{d1}$ having an adjusted amplitude or phase. The synchronization unit 110 may be communicatively coupled to any combination of the scaler 1211, the ADC 1212 and the calibration module 1213.

In an embodiment, the input module 121, 131, 141 of each channel is further configured to generate the discrete input signal $S_{d1}$-$S_{dN}$ by sampling the input signal $S_{in1}$-$S_{inN}$. The synchronization unit 110 may further be configured to synchronize the generated output signals by triggering the input modules of the plurality of channels $CH_1$-$CH_N$ to sample the input signals synchronously.

Figure 3:
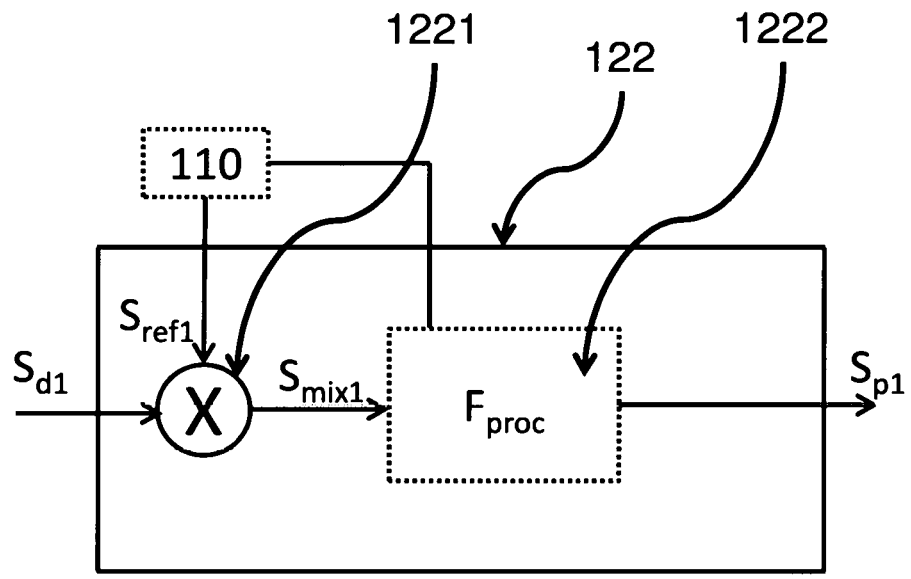
FIG. 3 shows details of a processing module according to the present disclosure.

FIG. 3 shows a processing module 122 according to the present disclosure. The processing module 122 may be configured to receive the discrete input signal $S_{d1}$ and generate the processed signal $S_{p1}$-$S_{pN}$. The discrete input signal $S_{d1}$ may be received from the input module, from the synchronization unit 110, e.g. as a simulated signal, or from an external source. The processing module 122 may comprise any combination of a mixer 1221 or a filter 1222 or a bypass coupling (not shown in the figure). The processing module 122 may comprise the mixer 1221 configured to mix the discrete input signal $S_{d1}$ with a channel reference signal $S_{ref1}$ to generate a mixed signal $S_{mix1}$ as the processed signal $S_{p1}$. The channel reference signal $S_{ref1}$ may be in a form that is a selection of any of an X, a Y or a DC signal. In one example, the reference signal $S_{ref1}$ to may be a sinoid or sinus shaped signal of an output frequency and an output phase (resulting e.g. in in-phase [X] component), 90 degree phase shifted sinoid (quadrature [Y] competent), square wave (e.g. boxcar), constant 1 (DC) etc. The channel reference signal $S_{ref1}$ may be provided by the synchronization unit 110. I.e. the synchronization unit 110 is configured to synchronize the generated output signals, e.g. by providing synchronized channel reference signals to each of the channels. The processing module 122 may further comprise a filter 1222 configured to filter the mixed signal $S_{mix1}$ or the discrete input signal $S_{d1}$, e.g. in response to or based on a control signal received from the synchronization unit 110, to generate the processed signal $S_{p1}$, e.g. to low-pass filtering the mixed signal $S_{mix1}$ using filter parameters received from the synchronization unit 110. The filter 1222 may be configured or triggered by the synchronization unit 110. The synchronization unit 110 may be communicatively coupled to the mixer 1221 or the filter 1222. The synchronization unit 110 may further be configured to synchronize the generated output signals by triggering the processing modules 122, 132, 142 of each channel to low-pass filter the discrete input signals synchronously.

In an embodiment, the processing module 122 is configured with a bypass coupling (not shown in the figure) to generate the processed signal $S_{p1}$ or the mixed signal $S_{mix1}$ as the discrete input signal $S_{d1}$. In one example, the mixer 1221 of the processing module 122 or the processing module 122 as such is effectively bypassed by multiplying or scaling the processed signal $S_{p1}$ or the mixed signal $S_{mix1}$ with a factor 1. At least one advantage of this embodiment is that un-modulated or dead current, DC, signals may be included synchronously in the aggregated signal or value.

Figure 4A:
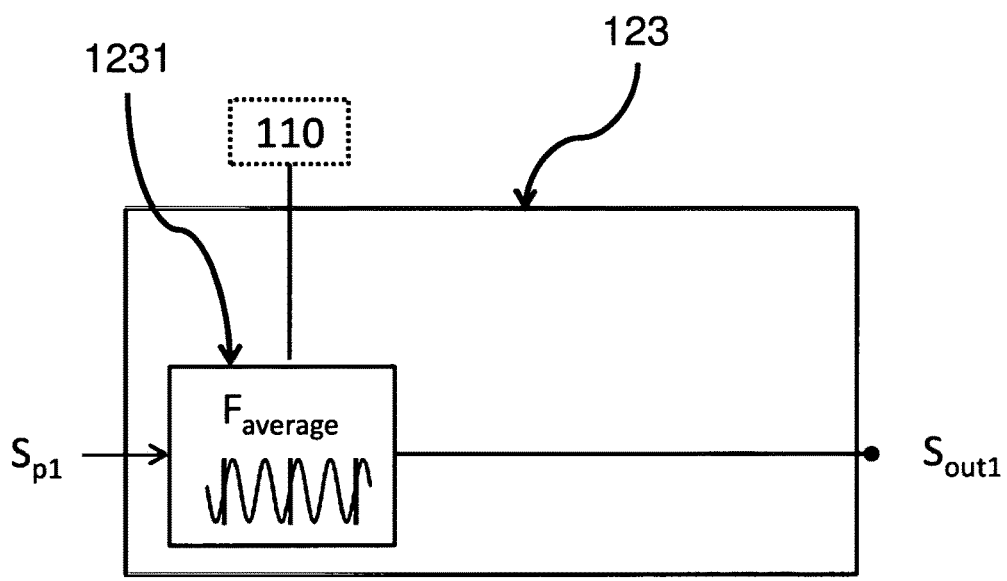
FIGS. 4A and 4B shows an output module according to the present disclosure.
Figure 4B:
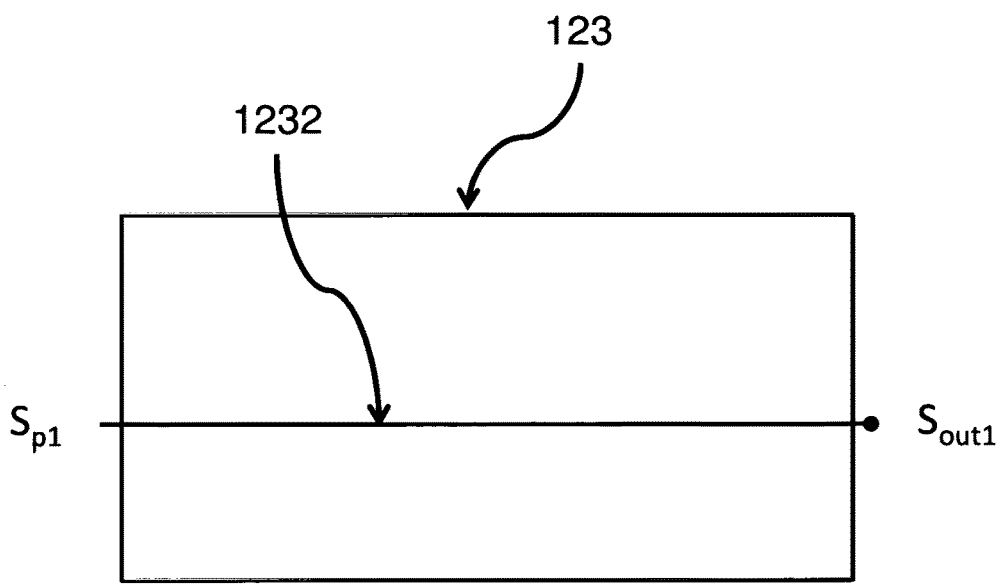

FIGS. 4A and 4B shows an output module 123 according to the present disclosure. The output module 123 may be configured to receive the processed signal $S_{p1}$ and generate the output signal $S_{out1}$.

In FIG. 4A, the output module 123 may be configured to generate the output signal $S_{out1}$ by calculating an average, e.g. over time, based on the processed signal $S_p$. The output module 123 may further comprise an averaging filter $F_{average}$ 1231 configured to calculate the average by filtering the processed signal $S_{p1}$ based on a control signal received from synchronization unit 110. In an embodiment, the averaging filter $F_{average}$ may be configured to generate the output signal $S_{out1}$ based on a section of the processed signal $S_{p1}$ falling within a time window. In an embodiment, the averaging filter $F_{average}$ may be configured to generate the output signal $S_{out1}$ based on a plurality of sections of the processed signal $S_{p1}$ falling within successive time windows having the same duration. In one example, a first partial average is calculated based on a first section of the plurality of sections and a second partial average is calculated based on a second different section of the plurality of sections. The average is then calculated by combining the first and second partial average. In yet an example, the control signal is indicative of the time window or time windows and of the number of sections forming the plurality of sections. The synchronization unit 110 may be communicatively coupled to the output module 123 or the averaging filter $F_{average}$. In an example, due to the averaging, the rate of discrete values in the output signal $S_{out1}$ is reduced compared to the processed signal $S_{p1}$, e.g. from 1000 values per second to 10 values per second when the plurality of sections comprise a 100 sections defined by the successive time windows.

In one example, the averaging is performed by a first averaging filter for the first channel and by a second averaging filter for the second channel. The synchronization unit 110 may then trigger the first averaging filter of the first output module of the first channel to start averaging simultaneously or substantially simultaneously with the second averaging filter of the second output module of the second channel. The synchronization unit 110 may then further trigger the first averaging filter of the first output module of the first channel to stop averaging simultaneously or substantially simultaneously with the second averaging filter of the second output module of the second channel. The synchronization unit 110 may further trigger the first averaging filter of the first output module of the first channel to generate the first output signal simultaneously or substantially simultaneously as the second averaging filter of the second output module of the second channel generates the second output signal. In other words, new or updated discrete values are presented substantially simultaneously on the respective output port. The synchronization unit 110 may then further configure all averaging filters to have the same number of sections or the same number of successive time windows. The successive time windows may be synchronized between the first and second channel, i.e. a time window of the first channel may have the same start and stop time as the corresponding time window of the second channel.

In an embodiment shown in FIG. 4B, the output module 123 is configured with a bypass coupling 1232 to generate the output signal $S_{out1}$ as the processed signal $S_{p1}$. In one example, the output module 123 is effectively bypassed by multiplying or scaling the processed signal $S_{p1}$ with a factor 1.

The synchronization unit 110 is, as mentioned above, configured to synchronize the generated output signals of the plurality of channels $CH_1$-$CH_N$, i.e. to trigger the output modules 123, 133, 143 to generate the output signals $S_{out1}$-$S_{outN}$ synchronously, e.g. new or updated discrete values are presented substantially simultaneously on the respective output port.

In embodiments, the synchronization unit 110 may be further be configured to synchronize the generated output signals by further synchronizing any of a selection of generating the discrete input signals $S_{d1}$-$S_{dN}$ of each channel, by the input modules 121, 131, 141, or generating the processed signals $S_{p1}$-$S_{pN}$ of each channel, the processing modules 122, 132, 142. In one example, the generation of digital or discrete signals by the input modules 121, 131, 141 are triggered simultaneously or substantially simultaneously by the synchronization unit 110 by sending control signals or the generation of processed signals by the processing modules 122, 132, 142 are triggered simultaneously or substantially by the synchronization unit 110 by sending control signals. In embodiments, the synchronization unit 110 may further be configured to synchronize the generated output signals by controlling the output modules 123, 133, 143 to filter the processed signals using the same time window, i.e. to filter the processed signals synchronously. The synchronization unit 110 may further be configured to generate the channel reference signal for each channel based on a common reference signal.

In an embodiment, the synchronization unit 110 is further configured to synchronize the generated output signals by controlling the output modules to filter the processed signals using the time window that is aligned to a first multiple of full periods of the common reference signal. In an example, the reference signal is a sinus signal, where each full period is initiated at a period start time with amplitude of zero and after reaching amplitude maxima and minima returns to amplitude of zero at a period stop time. In one example, the time window is aligned to a first multiple of full periods of the common reference signal by defining the start time of the window as the first period start time and the stop time of the window as the last period stop time. This embodiment has the advantage of further improving the quality of the aggregated value by using synchronized signals.

Figure 5:
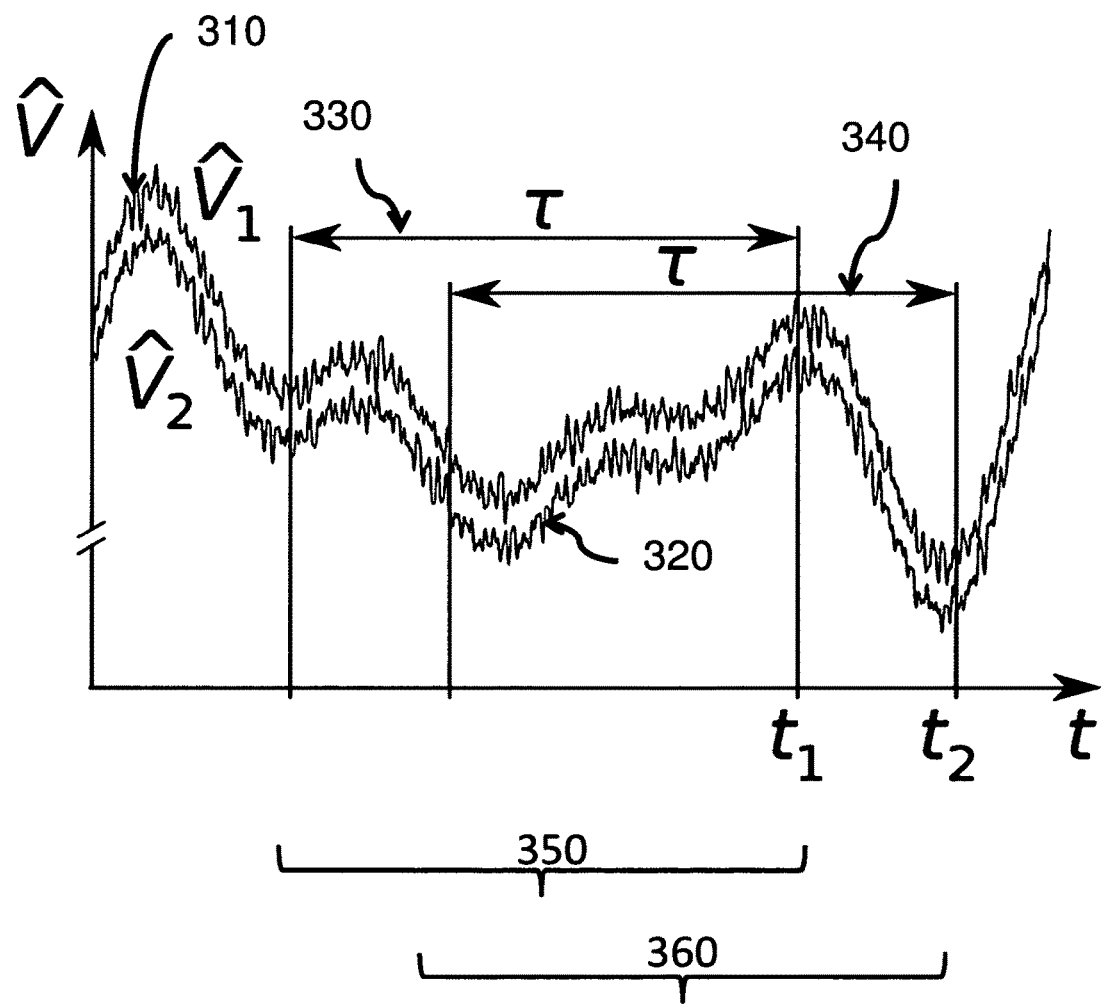
FIG. 5 shows a diagram illustrating time windows applied to signals.

FIG. 5 shows a diagram illustrating time windows applied to signals, e.g. the processed signals. The diagram comprises a vertical axis indicating amplitude or voltage values $\hat{V}_2$ of signals in the diagram, e.g. a first processed signal $\hat{V}_1$ and a second processed signal $\hat{V}_2$. The diagram further comprises a horizontal axis indicating time t. A first signal 310 is shown having a first amplitude $\hat{V}_1$. A second signal 320 is shown having a second amplitude $\hat{V}_2$. A first section of the first signal 310 is falling within a first time window 350. A first section of the second signal 320 is also falling within the first time window 350. A second section of the first signal 310 is falling within a second time window 360. A second section of the second signal 320 is also falling within the second time window 360. In a first example, a section of the first signal 310, falling within the first time window 350, is combined with a section of the second signal 320, also falling within the first time window 350, to generate a first aggregated value. In a second example, a section of the first signal 310, falling within the first time window 350, is combined with a section of the second signal 320, falling within the second time window 360, to generate a second aggregated value. As can be realized from FIG. 3, the first aggregated value and the second aggregated value will differ. Thus, the lack of synchronization between channels reduces the quality of the aggregated value. It may be realized that if the variations in the amplitude of the first signal 310 and the second signal 320 is mainly due to variations of the signal generator or signal source providing the measured object with a signal, then the quality of or the variations of the aggregated value is reduced if processing of the plurality of channels $CH_1$-$CH_N$ are synchronized. This result is achieved by the present disclosure by synchronizing a selection of any of the input modules, the processing modules or the output modules.

In an example, the output modules 123, 133, 143 of each channel is configured to calculate the average by filtering the at least one processed signal $S_{p1}$-$S_{pN}$ by an averaging filter $F_{average}$, wherein the averaging filter $F_{average}$ is configured to generate the at least one output signal $S_{out1}$-$S_{outN}$ based on a section of the processed signal $S_{p1}$-$S_{pN}$ falling within a time window. The synchronization unit 110 is further configured to control the output modules, e.g. by sending a control signal, to filter the processed signals using a time window with a starting time that is synchronized. The time windows may further have the same length or duration 330, 340 T. Synchronization of time windows is further described in relation to FIG. 4.

In one example with reference to FIG. 4, the first processed signal of a first channel, falling within the first time window 350 is processed by a first averaging filter $F_{average}$ to calculate a first average. The second processed signal of a second channel, also falling within the first time window 350, is processed by a second averaging filter $F_{average}$ to calculate a second average. This embodiment has the advantage of further improving the quality of the aggregated value by using synchronized signals.

Even though two signals being combined to an aggregated value use aligned time windows, it may be realized that the quality of the aggregated value can be further improved by considering multiples of full periods of a common reference signal as previously described.

In an example, the synchronization unit 110 is configured to control the output modules to filter the processed signals using a time window that is aligned to a first multiple of full periods of the common reference signal. Aligning to a first multiple of full periods may include generating intermediate signal values and aligning the time window to one of these intermediate discrete input signal values. In one example, the signal values are discrete input signal values and the exact point in time when the common reference signal initiates a period, is between two discrete input signal points. The lock in amplifier may then be configured to generate at least one intermediate discrete signal value corresponding to an exact point in time when the signal initiates a period, e.g. by interpolation, and align the starting point of the time window to the exact point in time when the common reference signal initiates a period.

Figure 6:
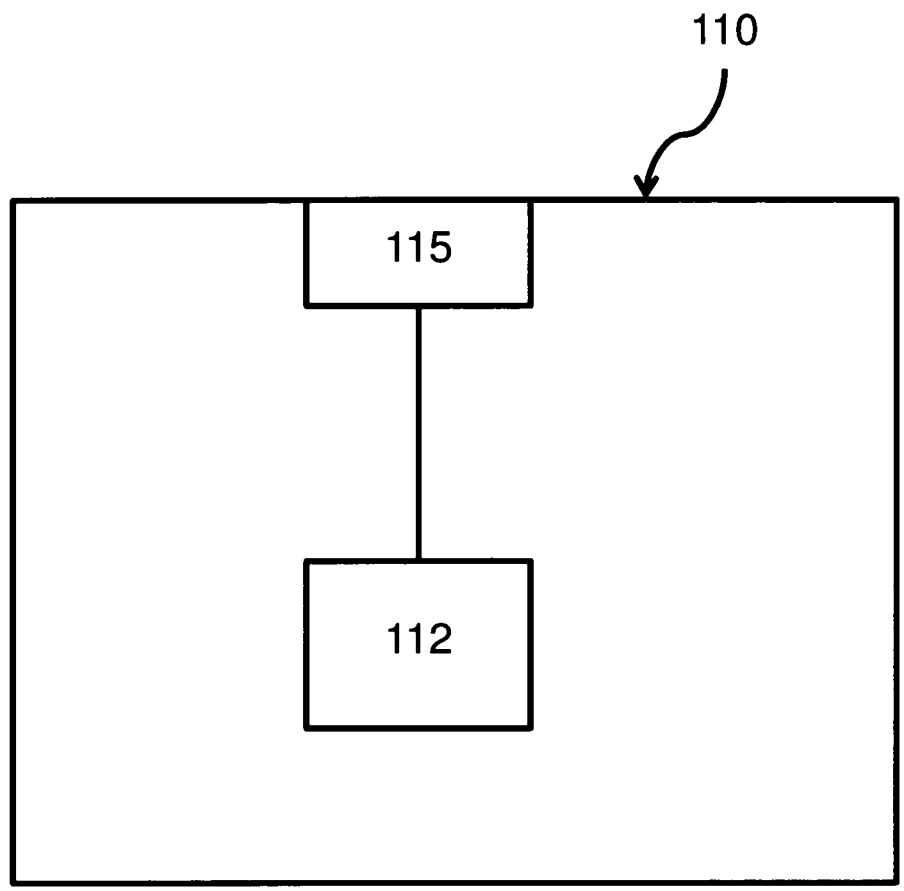
FIG. 6 shows a synchronization unit according to an embodiment of the present invention.

FIG. 6 shows a synchronization unit 110 according to an embodiment of the present invention. The synchronization unit 110 may be in the form of an Electronic Control Unit or an on-board computer. The synchronization unit 110 may comprise a processor 112. In one example, the processor 112 may be any of a selection of processing circuitry and/or a central processing unit and/or processor modules and/or multiple processors configured to cooperate with each-other. Further, the synchronization unit 110 may further comprise a memory 115. The memory 115 may contain instructions executable by the processor to perform the methods described herein. The processor 112 may be communicatively coupled to the memory 115. In a further embodiment, the synchronization unit 110 may further comprise and/or be coupled to one or more additional sensors configured to receive and/or obtain and/or measure physical properties pertaining lock-in amplifier and send one or more sensor signals indicative of the physical properties of the input signals or the environment of the synchronization unit 110 to the processing means 112.

In one or more embodiments, there is provided a computer program product comprising code portions adapted to control a processor to perform any of the steps or functions of any of the embodiments described herein. Software in accordance with the present disclosure, such as program code portions and/or data, can be stored in non-transitory form on one or more machine-readable mediums. It is also contemplated that software identified herein can be implemented using one or more general purpose or specific purpose computers and/or computer systems, networked and/or otherwise.

Where applicable, one or more embodiments provided by the present disclosure can be implemented using hardware, software, or combinations of hardware and software. In one example embodiment any or all of the input modules, processing modules, output modules or the synchronization unit be implemented using hardware, software, or combinations of hardware and software, e.g. as software executed by a processor such as an Field-Programmable Gate Array FPGA.

Also where applicable, the various hardware components and/or software components set forth herein can be combined into composite components comprising software, hardware, and/or both. Where applicable, the various hardware components and/or software components set forth herein can be separated into sub-components comprising software, hardware, or both. In addition, where applicable, it is contemplated that software components can be implemented as hardware components, and vice-versa. Where applicable, the ordering of various steps described herein can be changed, combined into composite steps, and/or separated into sub-steps to provide features described herein.

In one embodiment, a computer program is provided comprising computer-executable instructions for causing the lock-in amplifier when the computer-executable instructions are executed on a processing unit comprised in the synchronization unit 110, to perform any of the methods described herein. Furthermore, any methods according to embodiments of the invention may be implemented in a computer program, having code means, which when run by processing means causes the processing means to execute the steps of the method. The computer program is included in a computer readable medium of a computer program product.

In one embodiment, a computer program product is provided comprising a computer-readable storage medium, the computer-readable storage medium having the computer program above embodied therein.

In one embodiment, a carrier containing the computer program above, wherein the carrier is one of an electronic signal, optical signal, radio signal, or computer readable storage medium.

In an embodiment, a computer program product comprising a memory and/or a computer-readable storage medium, the computer-readable storage medium having the computer program described above embodied therein. The memory and/or computer-readable storage medium referred to herein may comprise of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

In embodiments, the communications network communicate using wired or wireless communication techniques that may include at least one of a Local Area Network (LAN), Metropolitan Area Network (MAN), Global System for Mobile Network (GSM), Enhanced Data GSM Environment (EDGE), Universal Mobile Telecommunications System, Long term evolution, High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX) and ultrasonic communication, etc., but is not limited thereto.

Moreover, it is realized by the skilled person that the synchronization unit 110 may comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

Especially, the processor and/or processing means of the present disclosure may comprise one or more instances of processing circuitry, processor modules and multiple processors configured to cooperate with each-other, Central Processing Unit (CPU), a processing unit, a processing circuit, a processor, an Application Specific Integrated Circuit (ASIC), a microprocessor, a Field-Programmable Gate Array (FPGA) or other processing logic that may interpret and execute instructions. The expression "processor" and/or "processing means" may thus represent a processing circuitry comprising a plurality of processing circuits, such as, e.g., any, some or all of the ones mentioned above. The processing means may further perform data processing functions for inputting, outputting, and processing of data comprising data buffering and device control functions, such as call processing control, user interface control, or the like.

Finally, it should be understood that the invention is not limited to the embodiments described above, but also relates to and incorporates all embodiments within the scope of the appended independent claims.

The invention claimed is:

1. A lock-in amplifier comprising:
a plurality of channels ($CH_1$-$CH_N$), wherein each channel of the plurality of channels ($CH_1$-$CH_N$) is configured to receive an input signal ($S_{in1}$-$S_{inN}$) and generate an output signal ($S_{out1}$-$S_{outN}$),
an aggregation module (150) configured to receive the generated output signals ($S_{out1}$-$S_{outN}$), and generate an aggregated signal ($S_{agg}$) based on the generated output signals ($S_{out1}$-$S_{outN}$),
a synchronization unit (110) configured to synchronize the generated output signals ($S_{out1}$-$S_{outN}$) of the plurality of channels ($CH_1$-$CH_N$),
wherein each channel comprises at least:
a processing module (122, 132, 142) configured to receive a discrete input signal ($S_{d1}$-$S_{dN}$) and generate a processed signal ($S_{p1}$-$S_{pN}$), and
an output module (123-143) configured to receive the processed signal ($S_{p1}$-$S_{pN}$) and generate the output signal ($S_{out1}$-$S_{outN}$),
wherein the synchronization unit (110) is configured to further synchronize any of a selection of the generation of discrete input signals ($S_{d1}$-$S_{dN}$) of the plurality of channels ($CH_1$-$CH_N$) and the generation of processed signals ($S_{p1}$-$S_{pN}$) of the plurality of channels ($CH_1$-$CH_N$).

2. The lock in amplifier according to claim 1, wherein the output module (123, 133, 143) of each channel is configured to:
generate the output signal ($S_{out1}$-$S_{outN}$) by calculating an average based on the processed signal ($S_{p1}$-$S_{pN}$), and
wherein the synchronization unit (110) is further configured to trigger the output modules (123, 133, 143) of each channel to generate the output signals ($S_{out1}$-$S_{outN}$) synchronously.

3. The lock in amplifier according to claim 2, wherein the output module (123, 133, 143) of each channel is configured to:
calculate the average by filtering the processed signal ($S_{p1}$-$S_{pN}$) by an averaging filter ($F_{average}$), wherein the averaging filter ($F_{average}$) is configured to generate the output signal ($S_{out1}$-$S_{outN}$) based on a section of the processed signal ($S_{p1}$-$S_{pN}$) falling within a time window,
wherein the synchronization unit (110) is further configured to control the output modules (123, 133, 143) to filter the processed signals using the same time window.

4. The lock in amplifier according to claim 3, wherein the synchronization unit (110) is further configured to control the output modules to filter the processed signals using the time window which is aligned to a first multiple of full periods of a common reference signal.

5. The lock in amplifier according to claim 1, wherein the output module (123-143) of each channel is configured to:
generate the output signal ($S_{out1}$-$S_{outN}$) as the processed signal ($S_{p1}$-$S_{pN}$).

6. The lock in amplifier according to any of claims 1-5, further comprising an input module (121, 131, 141) configured to receive the input signal ($S_{in1}$-$S_{inN}$) and generate a discrete input signal ($S_{d1}$-$S_{dN}$), wherein the input module (121, 131, 141) of each channel is configured to:
generate the discrete input signal ($S_{d1}$-$S_{dN}$) by sampling the input signal ($S_{in1}$-$S_{inN}$),
wherein the synchronization unit (110) is further configured to trigger the input modules to sample the input signals synchronously.

7. The lock in amplifier according to any of claims 1-5, wherein the processing module (122, 132, 142) of each channel is configured to:
generate the processed signal ($S_{p1}$-$S_{pN}$) by mixing the discrete input signal ($S_{d1}$-$S_{dN}$) with a channel reference signal for the channel to form a mixed signal ($S_{mix1}$-$S_{mixN}$),
wherein the synchronization unit (110) is further configured to generate channel reference signals for each channel based on a common reference signal.

8. The lock in amplifier according to claim 7, wherein the processing module (122, 132, 142) of each channel is further configured to:
generate the processed signal ($S_{p1}$-$S_{pN}$) by low-pass filtering the mixed signal ($S_{mix1}$-$S_{mixN}$),
wherein the synchronization unit (110) is further configured to trigger the processing modules to low-pass filter the mixed signals synchronously.

9. The lock in amplifier according to any of claims 1-5, wherein the processing module (122, 132, 142) of each channel is configured to:
generate the processed signal ($S_{p1}$-$S_{pN}$) as the discrete input signal ($S_{d1}$-$S_{dN}$).

10. The lock in amplifier according to claim 9, wherein generating the processed signal ($S_{p1}$-$S_{pN}$) further comprises low-pass filtering the discrete input signal ($S_{d1}$-$S_{dN}$),
wherein the synchronization unit (110) is further configured to trigger the processing modules to low-pass filter the discrete input signals synchronously.

* * * * *